United States Patent [19]
Takase et al.

[11] Patent Number: 5,341,326
[45] Date of Patent: Aug. 23, 1994

[54] SEMICONDUCTOR MEMORY HAVING MEMORY CELL UNITS EACH INCLUDING CASCADE-CONNECTED MOS TRANSISTORS

[75] Inventors: Satoru Takase; Natsuki Kushiyama, both of Yokohama; Tohru Furuyama, Tokyo, all of Japan

[73] Assignee: Kabushiki Kaisha Toshiba, Kawasaki, Japan

[21] Appl. No.: 833,045

[22] Filed: Feb. 10, 1992

[30] Foreign Application Priority Data

Feb. 13, 1991 [JP] Japan ................... 3-041321

[51] Int. Cl.$^5$ ............... G11C 11/24; G11C 11/34
[52] U.S. Cl. ..................... 365/149; 365/102; 365/174
[58] Field of Search ............. 365/149, 102, 174; 257/296, 268, 269, 299

[56] References Cited

U.S. PATENT DOCUMENTS

| | | | |
|---|---|---|---|
| 4,225,945 | 9/1980 | Kuo | 365/149 |
| 4,593,382 | 6/1986 | Fujishima et al. | 365/149 |
| 4,648,073 | 5/1987 | Kenney | 365/149 |
| 4,669,063 | 5/1987 | Kirsch | 365/149 X |
| 4,758,987 | 7/1988 | Sakui | 365/189 |
| 4,943,944 | 7/1990 | Sakui et al. | 365/189.05 |
| 4,980,863 | 12/1990 | Ogihara | 365/205 |
| 5,025,294 | 6/1991 | Ema | 257/296 |
| 5,051,954 | 9/1991 | Toda et al. | 365/189.02 |
| 5,079,746 | 1/1992 | Sato | 365/225.7 |
| 5,091,761 | 2/1992 | Hiraiwa et al. | 357/23.6 |
| 5,172,198 | 12/1992 | Aritome et al. | 257/315 |
| 5,184,326 | 2/1993 | Hoffmann et al. | 365/201 |

FOREIGN PATENT DOCUMENTS 0157051 10/1985 European Pat. Off. .
0398244 11/1990 European Pat. Off. .

OTHER PUBLICATIONS

Ohta et al., "Quadruply Self-Aligned Stacked High--Capacitance RAM Using Ta$_2$O$_5$ High Density VLSI Dynamic Memory", IEEE Transactions on Electron Devices, vol. ED-29, No. 3, Mar. 1982, pp. 368-376.

Kimura, et al., "A Block-Oriented RAM with Half-Sized DRAM Cell and Quasi-Folded Data-Line Architecture," ISSCC 91, pp. 106-107, Feb. 14, 1991.

Arimoto et al., "A Circuit Design of Intelligent CDRAM wtih Automatic Write Back Capability", 1990 Symposium on VLSI Circuits, Digest of Technical Papers, pp. 79-80.

Shah et al., "A 4Mb DRAM with Cross-point Trench Transistor Cell", 1986 ISSCC Digest of Technical Papers, pp. 268-269.

Ema et al., "3-Dimensional Stacked Capacitor Cell for 16M AND 64M DRAMs", 1988 IEDM Technical Digest, pp. 592-595.

Watanabe et al., "Stacked Capacitor Cells for High--density dynamic RAMs", 1988 IEDM Technical Digest, pp. 600-603.

Sunouchi et al., "A Surrounding Gate Transistor (SGT) Cell for 64/256 MBit DRAMS", 1989 IEDM Technical Digest, pp. 23-26.

Fujishima et al., "A Storage-Node-Boosted RAM with Word-Line Delay Compensation", IEEE Journal of Solid State Circuits, vol. SC-17, No. 5, pp. 872-875, Oct. 1982.

Ohta et al., "A Novel Memory Cell Architecture for High-Density DRAMs", 1989 Symposium of VLSI Circuits, Digest of Tech. Papers, pp. 101-102.

*Primary Examiner*—Eugene R. LaRoche
*Assistant Examiner*—Son Dinh
*Attorney, Agent, or Firm*—Banner, Birch, McKie & Beckett

[57] ABSTRACT

A semiconductor memory cell comprises a cascade gate including a plurality of cascade-connected MOS transistors and having one end connected to a first node, and a plurality of capacitors for data storage connected at one end to the MOS transistors, respectively at the end remote from the node, and there is a predetermined regulation in relation of the capacitance of the capacitors.

43 Claims, 5 Drawing Sheets

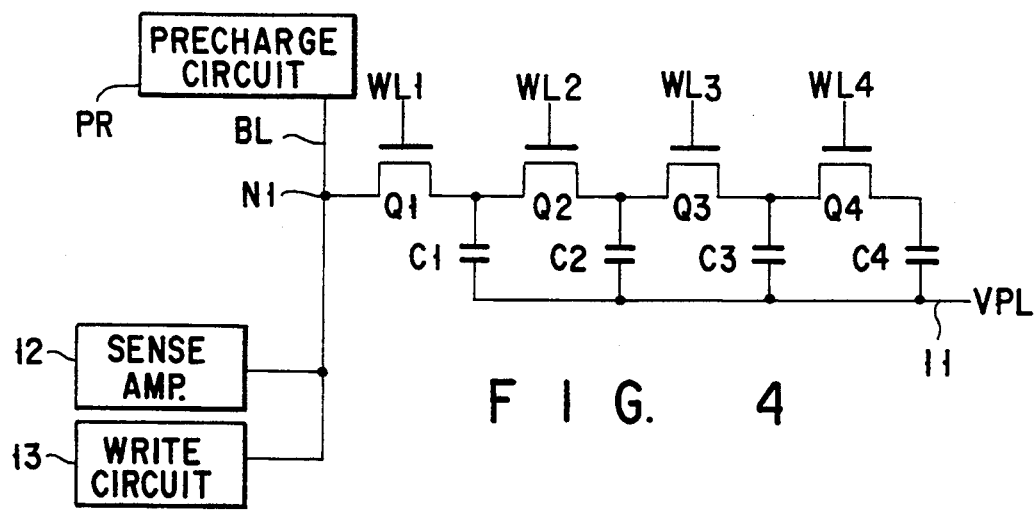
F I G. 4
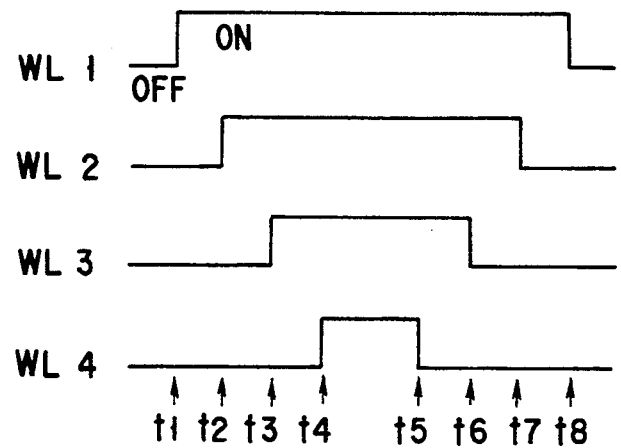
F I G. 5
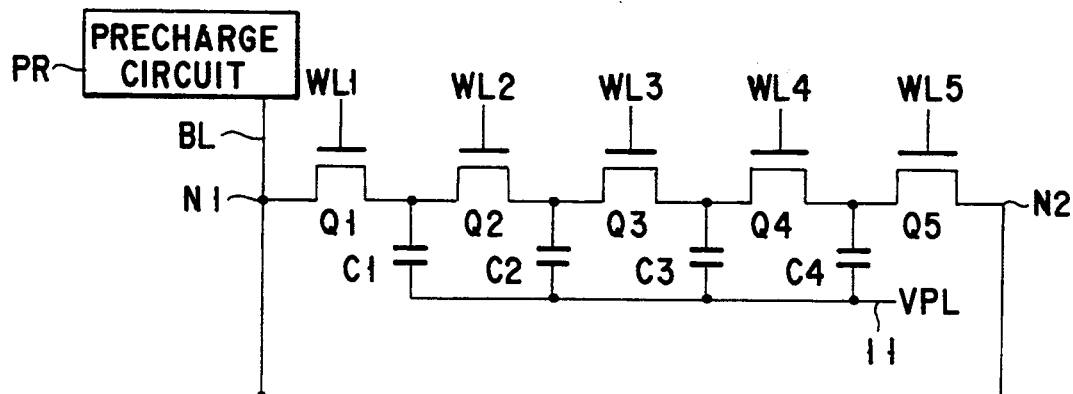
F I G. 6

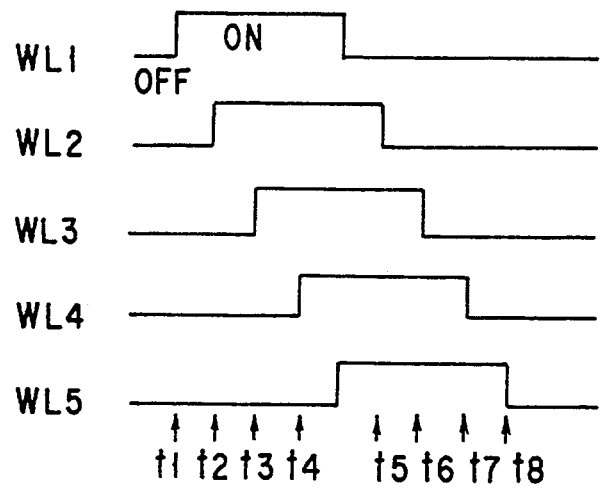
F I G. 7
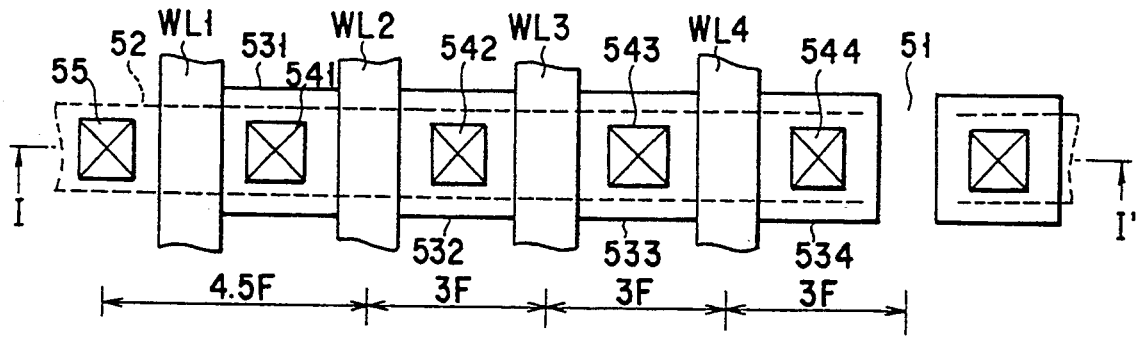
F I G. 8A
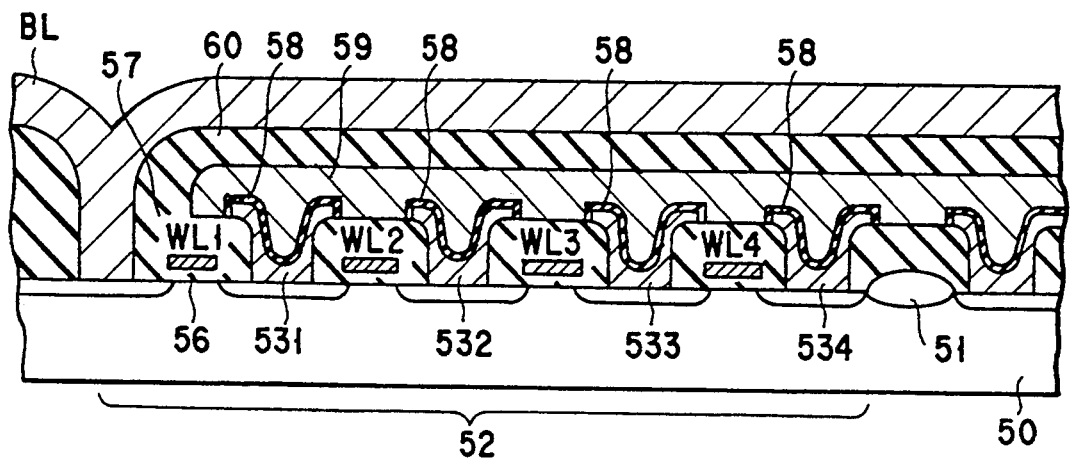
F I G. 8B

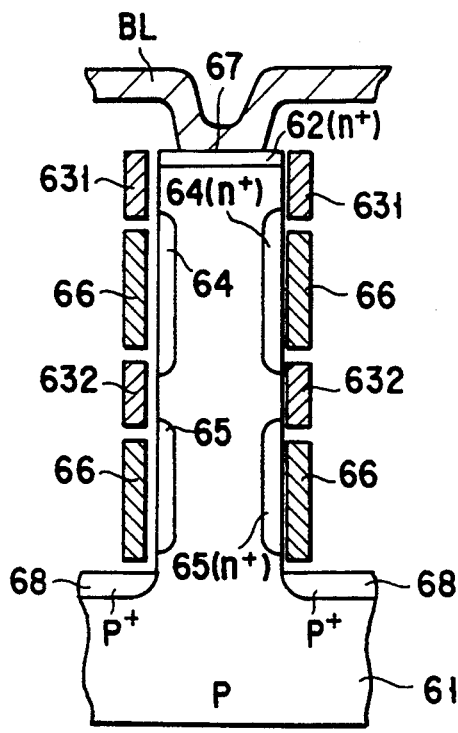
F I G. 9A
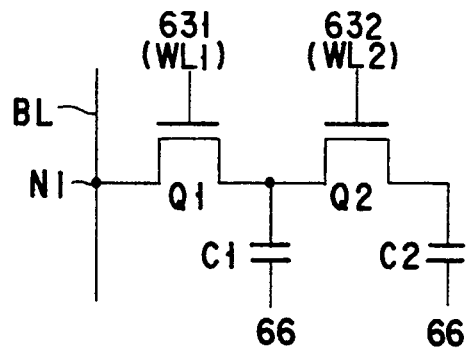
F I G. 9B
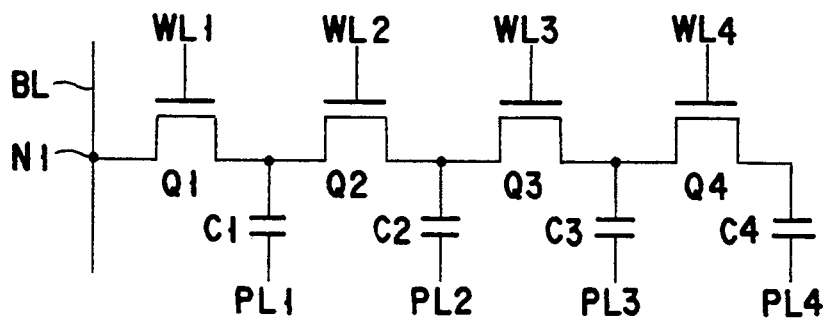
F I G. 10

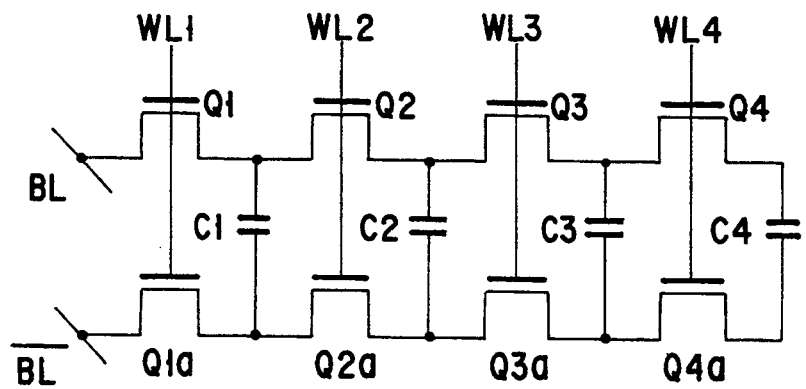
F I G. 11
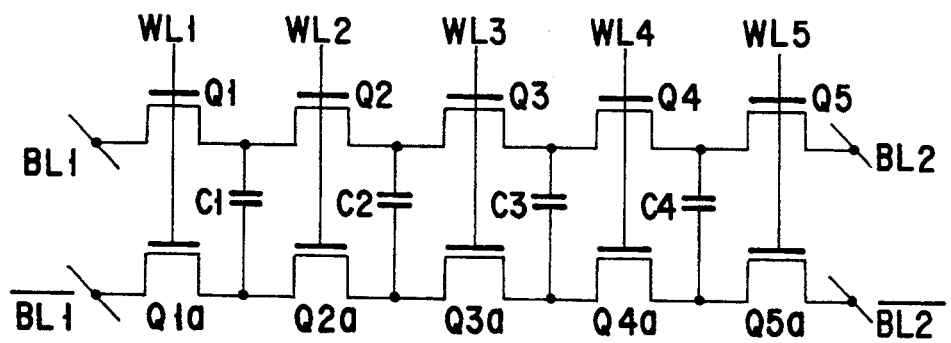
F I G. 12

5,341,326

SEMICONDUCTOR MEMORY HAVING MEMORY CELL UNITS EACH INCLUDING CASCADE-CONNECTED MOS TRANSISTORS

BACKGROUND OF THE INVENTION

1. Field of the Invention

The present invention relates to a semiconductor memory cell, particularly, to a memory cell used in, for example, a dynamic random access memory (DRAM).

2. Description of the Related Art

FIG. 1 shows a memory cell widely used nowadays in a DRAM. As shown in the drawing, the memory cell comprises a MOS (insulated gate) transistor Q acting as a transfer gate, which is connected to a word line WL and a bit line BL, and a capacitor C for data storage having a capacitor plate potential VPL connected to one end thereof.

To more highly integrate DRAM cells to thereby reduce the unit cost per bit of the memory cell, one of the inventors of the invention has proposed, in U.S. application Ser. No. 687,687, cascade gate type semiconductor memory cells shown in FIGS. 4 and 6.

The DRAM cell shown in FIG. 4 comprises a cascade gate including a plurality of cascade-connected MOS transistors Q1–Q4 and having one end connected to a read/write node N1, and a plurality of capacitors C1–C4 for data storage connected respectively to said MOS transistors Q1–Q4. In the semiconductor memory cell, the MOS transistors Q1–Q4 are sequentially turned on or off in a predetermined order so as to sequentially read data stored in the capacitors C1–C4 onto the read/write node N1 which is connected to a bit line in the order mentioned, and the read-out write-in data can be sequentially written into the capacitors C4–C1 from the node N1 in the order mentioned.

The DRAM cell shown in FIG. 6 is similar that shown in FIG. 4 except that is further incorporates a second node N2 and a MOS transistor Q5 connected between the transistor Q4 and node N2. Also in the DRAM cell of FIG. 6, by turning on or off the transistors Q1–Q5 in a predetermined order so as to sequentially read data stored in the capacitors C1–C4 onto the node N1 in the order mentioned, and the data can be sequentially written into the capacitors C1–C4 from the node N2 in the order mentioned.

The above described cascade gate type memory cells shown in FIGS. 4 and 6 can store data of a plurality of bits in units of one bit. Thus, as compared with a conventional DRAM consisting of an array of one transistor-one capacitor type cells, leading to a remarkably highly integrated DRAM can be formed of an array of memory cells of the cascade gate type, thereby much reducing the unit cost per bit of the memory cell, since only one contact is required to connect a plurality of cells or bits to a bit line.

By the way, when data stored in the capacitors C1–C4 is sequentially read onto the node N1, a capacitor which has been accessed (e.g., C1) remains connected electrically to the node N1. Therefore, when another capacitor (e.g., C2) is accessed, part of the readout charges are distributed to the above described capacitor C1. In this case, if the capacitors C1–C4 have same capacitance, the voltage variation of the node N1 which occurs while the capacitors C2–C4 are successively accessed is gradually reduced compared with the voltage variation of the node N1 which occurs while the capacitor C1 is accessed. In the extreme case, when the capacitor C4 is accessed, part of the read-out charges are distributed to the capacitors C1–C3, and the voltage variation of the node N1 is extremely reduced, so that data are in danger of being erroneously read out.

SUMMARY OF THE INVENTION

This invention has been made in consideration of the above described circumstances, and therefore has the object to provide a semiconductor memory cell which can form a remarkably highly integrated memory cell array, thereby much reducing the cost of one bit of the memory cell, moreover the voltage variation of the read node will have substantially the same value when any of the capacitors is accessed.

To achieve the object noted above, the present invention provides a semiconductor memory cell comprising, a first node for reading data, a first cascade gate including a plurality of cascade-connected first MOS transistors and having one end connected to the first node, and a plurality of capacitors for data storage connected at one end to the first MOS transistors, respectively, at the end remote from the node, and there is a predetermined regulation in relation of the capacitance of the capacitors.

The present invention also provides a semiconductor memory cell comprising, a first node for reading data, a second node for writing data, a first cascade gate at least three cascade-connected first MOS transistors arranged between the first node and the second node, and a plurality of capacitors for data storage each connected at one end to the connection nodes between adjacent the first MOS transistors forming the cascade gate, respectively, and there is a predetermined regulation in relation of the capacitance of said capacitors.

In the semiconductor memory cell of the present invention, the MOS transistors forming the cascade gate are sequentially turned on or off in a predetermined order so as to sequentially read data stored in the capacitors onto the first node. Further, the data can be sequentially written into the capacitors from the first node or the second node in the order mentioned. Moreover, by setting such that the regulation relates to the order of reading data from the capacitors, e.g., the more remote from the first node the capacitors of the memory cell are located, the larger capacitance they have, that gradual reduction in the voltage variation of the first node which occurs while the capacitors are successively accessed will be compensated, so that the voltage variation of the first node will have substantially the same value when any of the capacitors is accessed, thereby preventing data from being erroneously read out.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is an equivalent circuit diagram showing a semiconductor memory cell according to one embodiment of the present invention;

FIG. 5 shows wave forms denoting as an example the timing of the read operation and write operation of the memory cell shown in FIG. 4;

FIG. 6 is an equivalent circuit diagram showing a semiconductor memory cell according to another embodiment of the present invention;

FIG. 7 shows wave forms denoting as an example the timing of the read operation and write operation of the memory cell shown in FIG. 6;

FIG. 8A is a plan view showing that a stacked cell structure is employed in the semiconductor memory cell shown in FIG. 4;

FIG. 8B is a cross sectional view along the line I—I shown in FIG. 8A;

FIG. 9A is a cross sectional view showing an example of the semiconductor memory cell of the present invention employing a cross point cell structure;

FIG. 9B is an equivalent circuit diagram showing the semiconductor memory cell shown in FIG. 9A;

FIG. 10 is an equivalent circuit diagram showing a modification of the memory cell shown in FIG. 4;

FIG. 11 is an equivalent circuit diagram showing another modification of the memory cell shown in FIG. 4; and FIG. 12 is an equivalent circuit diagram showing a modification of the memory cell shown in FIG. 6.

DETAILED DESCRIPTION OF THE PREFERRED EMBODIMENTS

Figure 1:
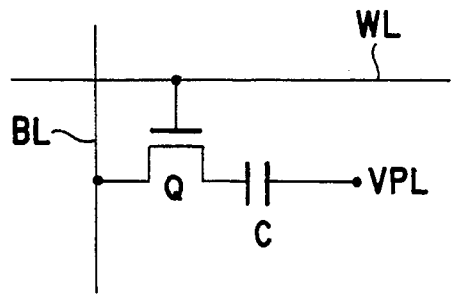
FIG. 1 is an equivalent circuit diagram showing the construction of a conventional DRAM cell of one transistor-one capacitor type.

The accompanying drawings show some embodiments of the present invention. Throughout the drawings, like reference numerals denote the like members of the semiconductor memory cell.

Specifically, FIG. 4 shows a semiconductor memory cell according to a first embodiment of the present invention. As seen from the drawing, the memory cell comprises a first cascade gate consisting of a plurality of, e.g., four, cascade-connected first MOS transistors Q1 to Q4. One end of the first cascade gate, i.e., one end of the MOS transistor Q1 in the drawing, is connected to a first node N1 for reading/writing. Further, capacitors C1 to C4 for data storage are connected to the first MOS transistors Q1 to Q4, respectively, at the ends remote from the node N1, so as to form a DRAM cell. In this case, there is a predetermined regulation in relation to each capacitance of the capacitors C1 to C4, by setting such that the regulation relates to the order of reading data from the capacitors, e.g., the more remote from the first node the capacitors of the memory cell are located, the larger capacitance they have (C1<C2<C3<C4).

A memory cell array formed of a plurality of the DRAM cells described above is used in a DRAM. In this case, the gates of the first MOS transistors Q1 to Q4 are connected to word lines WL1 to WL4 of the memory cell array, respectively, with the node N1 connected to a bit line BL of the memory cell array. Further, the other ends of the capacitors C1 to C4 are commonly connected to a capacitor wiring 11 of the memory cell array. In this embodiment, the plate electrodes of the capacitors C1 to C4 are commonly connected to each other, and a predetermined capacitor plate potential VPL is given to the plate electrode commonly with another DRAM cell. As seen from the drawing, a bit line precharging circuit PR is connected to the bit line BL. A sense amplifier 12 senses and amplifies the potential of the bit line BL. Further, a write circuit 13 serves to set the potential of the bit line BL in accordance with the data to be written.

FIG. 5 shows timing wave forms exemplifying how the cascade gate type DRAM cell shown in FIG. 4 performs the read operation and write operation. In this embodiment, the word lines WL1 to WL4 are turned on or off at the timings shown in FIG. 5 so as to sequentially turn the first MOS transistors Q1 to Q4 on in this order and the transistors Q4 to Q1 off in this order. To be more specific, when the word line WL1 is turned on at the time t1 after precharging of the bit line BL to a predetermined potential by the bit line precharging circuit PR, the transistor Q1 is turned on, with the result that the data stored in the capacitor C1 is read through the transistor Q1 onto the bit line BL and, then, sensed by the sense amplifier 12. Then, when the word line WL2 is turned on at the time t2 after the bit line BL is precharged again for a predetermined period of time, the transistor Q2 is turned on, with the result that the data stored in the capacitor C2 is read through the transistors Q2 and Q1 onto the bit line BL. When the word line WL3 is turned on in the next stage at the time t3 after the bit line BL is precharged again for a predetermined period of time, the transistor Q3 is turned on, with the result that the data stored in the capacitor C3 is read through the transistors Q3, Q2 and Q1 onto the bit line BL. When the word line WL4 is turned on in the next stage at the time t4 after the bit line BL is precharged again for a predetermined period of time, the transistor Q4 is turned on, with the result that the data stored in the capacitor C4 is read through the transistors Q4, Q3, Q2 and Q1 onto the bit line BL. Further, when the word line WL4 is turned off at the time t5, the transistor Q4 is turned off so as to write the data of the bit line BL, i.e., the write data set by the write circuit 13, into the capacitor C4. When the word line WL3 is turned off in the next stage at the time t6, the transistor Q3 is turned off so as to write the data of the bit line BL into the capacitor C3. When the word line WL2 is turned off in the next stage at the time t7, the transistor Q2 is turned off so as to write the data of the bit line BL into the capacitor C2. Further, when the word line WL1 is turned off in the next stage at the time t8, the transistor Q1 is turned off so as to write the data of the bit line BL into the capacitor C1.

It is possible to rearrange the order of reading data, to correct an error, etc. during the series of the reading operation and the series of the writing operation described above, i.e., between the times t4 and t5 shown in FIG. 5.

In the above described operation, when the capacitor C2 is connected to the first node N1 at the time t2 after the capacitor C1 was connected to the first node N1, that is to say, the bit line BL at the time t1, the capacitor C1 functions such as the floating capacitor CB connected to the bit line BL, so that when the capacitor C2 is connected, part of the read-out charges are distributed to the capacitor C1. However, in this embodiment, because of the capacitance of the capacitor C2 is made larger than the capacitance of the capacitor C1, the gradual reduction in the voltage variation on the bit line BL which occurs while the capacitor C2 is accessed will be compensated, and the gradual reduction in the voltage variation on the bit line BL which occurs while the capacitor C3 and capacitor C4 are successively accessed will be also compensated, thereby preventing data from being erroneously read out.

In the cascade gate type DRAM cell composed of n pieces of MOS transistors and n pieces of capacitors, the reduction in the voltage variation on the read node N1 which occurs while the capacitors are successively accessed can be perfectly prevented, if the relation among the calculated capacitance of the capacitors is as follows:

$$C_n = C_l * \{1 + (C_l/C_B)\}^{n-1}$$

here,

Ci: a capacitor for data storage which is accessed 1st.
Cn: a capacitor for data storage which is accessed nth.
CB: floating capacitance connected to the bit line.

In the cascade gate type DRAM cell as shown in FIG. 4, it is possible to sequentially read onto the node N1 the data stored in the capacitors in the order starting with the data stored in the capacitor C1 positioned close to the node N1 and ending with the data stored in the capacitor C4 remote from the node N1 by sequentially turning the transistors Q1 to Q4 in a predetermined order. Moreover, gradual reduction in the voltage variation of the bit line BL which occurs while the capacitors are successively accessed will be compensated, thereby preventing data from being erroneously read out. It is also possible to sequentially write the data of the node N1 into the capacitors starting with the capacitor C4 remote from the node N1 and ending with the capacitor C1 close to the node N1.

The cascade gate type DRAM cell as shown in FIG. 4 is set such that the more remote from the first node the capacitors of the memory cell are located, the larger capacitance they have (C1<C2<C3<C4). However, the capacitance between a capacitor and and next one can be equal (e.g., C1=C2) so far as data are not read out erroneously, in other words, the more remote from the first node the capacitors of the memory cell are located, the larger or the same capacitance they can have.

In the embodiment shown in FIG. 4, the node N1 is connected to the bit line BL. However, it is possible to connect the node N1 directly to the input terminal of the sense amplifier 12.

FIG. 6 shows a semiconductor memory cell according to a second embodiment of the present invention. As seen from the drawing, the cascade gate type DRAM cell of the second embodiment comprises a cascade gate including a plurality of cascade-connected first MOS transistors Q1 to Q5 and connected between a first node N1 and a second node N2, and a plurality of capacitors C1 to C4 connected at one end to the connection nodes between adjacent MOS transistors, respectively. In this embodiment, it is necessary to use at least three MOS transistors forming the cascade gate, though five MOS transistors are shown in the drawing. In this DRAM cell, the capacitance of the capacitors C1 to C4 is set C1< or =C2< or =C3< or =C4.

A memory cell array is formed of a plurality of the DRAM cells constructed as shown in FIG. 6, and is used in a DRAM. The gates of the MOS transistors Q1 to Q5 are connected to word lines WL1 to WL5 of the memory cell array, respectively. The first node N1 and the second node N2 are commonly connected to the bit line BL of the memory cell array. The other ends of the capacitors C1 to C4 are commonly connected to the capacitor wiring 11 of the memory cell array. In this embodiment, a capacitor plate potential VPL is imparted to the capacitor wiring 11.

FIG. 7 shows timing wave forms exemplifying how the memory cell shown in FIG. 4 performs the read operation and write operation. In this embodiment, the word lines WL1 to WL5 are turned on or off at the timings shown in FIG. 7 so as to sequentially turn the first MOS transistors Q1 to Q5 on in this order and turn the transistors Q5 to Q1 off in this order. When the transistors Q1 to Q5 are sequentially turned on in this order, the data stored in the capacitors is sequentially read onto the node N1 starting with the data stored in the capacitor C1 close to the node N1 and ending with the data stored in the capacitor C4 remote from the node N1, as described previously with reference to FIG. 5- Then, the word line WL1 is turned off so as to turn the transistor Q1 off, and the word line WL5 is turned on so as to turn the transistor Q5 on. This operation may be reversed. When the word line WL2 is turned off in the next stage at the time t5, the transistor Q2 is turned off so as to write the data of the node N2 in the capacitor C1. When the word line WL3 is turned off in the next stage at the time t6, the transistor Q3 is turned off so as to write the data of the node N2 in the capacitor C2. Further, if the word line WL4 is turned off in the next stage at the time t7, the transistor Q4 is turned off so as to write the data of the node N2 in the capacitor C3. Finally, when the word line WL5 is turned off in the next stage at the time t8, the transistor Q5 is turned off so as to write the data of the node N2 in the capacitor C4.

It is possible to rearrange the order of reading data, to correct an error, etc. during the series of the reading operation and the series of the writing operation described above, i.e., between the times t4 and t5 shown in FIG. 7.

In the cascade gate type DRAM cell as shown in FIG. 6, it is possible to sequentially read onto the first node N1 the data stored in the capacitors in the order starting with the data stored in the capacitor C1 positioned close to the node N1 and ending with the data stored in the capacitor C4 remote from the node N1 by sequentially turning the transistors Q1 to Q5 in a predetermined order. Moreover, by setting such that the regulation in relation to each capacitance of the capacitors of the memory cell relates to the order of reading data from the capacitors, that gradual reduction in the voltage variation of the first node which occurs while the capacitors are successively accessed will be compensated, thereby preventing data from being erroneously read out. It is also possible to sequentially write the data of the node N2 into the capacitors in the order starting with the capacitor C1 close to the node N1 and ending with the capacitor C4 remote from to the node N1.

In the embodiment shown in FIG. 6, the first node N1 and the second node N2 are commonly connected to the same bit line BL. However, it is also possible for these first and second nodes N1 and N2 to be separately connected to different bit lines or different sense amplifiers.

The cascade gate type DRAM cell of the present invention is constructed as shown in, for example, FIG. 8. Specifically, FIG. 8A is a plan view showing the semiconductor memory cell shown in FIG. 4, which is formed as a stacked cell structure. The memory cell is used in a DRAM array, e.g., a DRAM cell array of an open bit line system, in which a memory node is formed at each of the intersections between the word lines and the bit line. FIG. 8B is a cross sectional view along the line I—I shown in FIG. 8A.

As shown in the drawings, the DRAM cell comprises a semiconductor substrate 50, a field isolation region 51, a cell active region 52 in which the active regions, i.e., source, drain and channel regions, of four transistors Q1 to Q4 are linearly arranged on the surface of the semiconductor substrate 50, gates (word lines) WL1 to WL4 of the transistors Q1 to Q4, storage nodes 531 to 534 of four capacitors C1 to C4 for data storage, contacts 541 to 544 between the storage nodes 531 to 534 and the source regions of the transistors Q1 to Q4, respectively, a contact 55 (bit line contact) between the drain region of the transistor Q1 and the bit line BL, a gate insulation film 56, an interlayer insulation film 57, an insulation film 58 for each of the capacitors C1 to C4, a plate electrode 59 for the capacitors C1 to C4, and an interlayer insulation film 60.

The capacitance of capacitors C1-C4 can be controlled by changing thickness, material or area of the insulation film of capacitors, and the other way of controlling them, are described in, 1989 IEDM Technical Digest, pp. 592-595 "3-DEMENSIONAL STACKED CAPACITOR CELL FOR 16M AND 64M DRAMS" or "Stacked Capacitor Cells for High-density dynamic RAMs" on PP.600-603 l of the literature noted above.

The bit line contact 55 is commonly used for another memory cell (not shown). In other words, a single bit line contact is commonly used for two memory cells (i.e., one contact per 8 bits or ½ contact per 4 bits).

Figure 2:
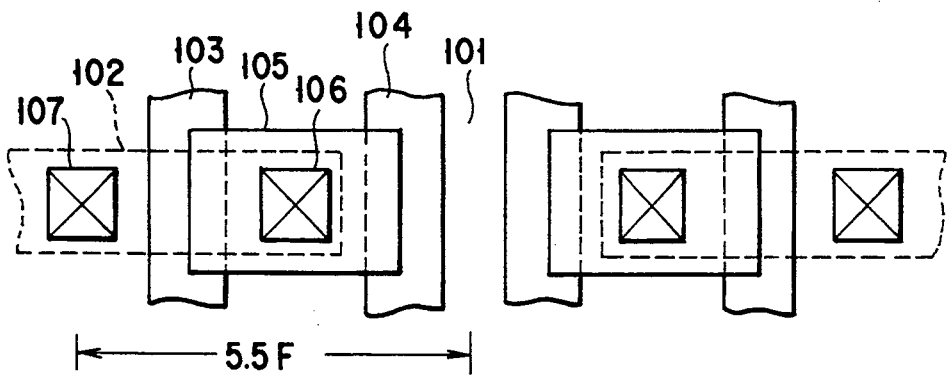
FIG. 2 is a plan view showing the construction of a stacked cell of one transistor-one capacitor type included in a DRAM cell array of a conventional folded bit line system.
Figure 3:
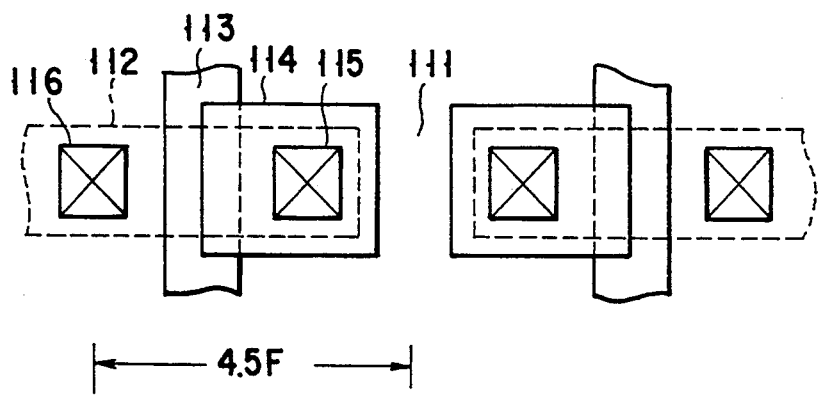
FIG. 3 is a plan view showing the construction of a stacked cell of one transistor-one capacitor type included in a DRAM cell array of a conventional open bit line system.

For comparison of the pattern area between the cascade gate type DRAM cell of the present invention shown in FIGS. 8A, 8B and the conventional one transistor-one capacitor type DRAM cell, FIG. 2 shows the plan view of the stacked cell in the conventional DRAM cell array of the folded bit line system. FIG. 3 is a plan view showing the stacked cell in the conventional DRAM cell array of the open bit line system. The stacked cell shown in FIG. 2 comprises a field isolation region 101, an active region 102 of a transistor for transfer gate, a gate (word line) 103 of the transistor, a word line 104 for another transistor (not shown), a storage node 105 of the capacitor for data storage, a contact 106 between the storage node 106 and the source region of the transistor, and a contact 107 between the drain region of the transistor and a bit line (not shown). The stacked cell further comprises a plate electrode (not shown) of the capacitor for data storage. On the other hand, the stacked cell shown in FIG. 3 comprises an element isolation region 111, an active region 112 of a transistor for transfer gate, a gate (word line) 113 of the transistor, a storage node 114 of a capacitor for data storage, a contact 115 between the storage node 114 and the source region of the transistor, and a contact 116 (bit line contact) between the drain region of the transistor and a bit line (not shown). The stacked cell further comprises a plate electrode (not shown) of the capacitor for data storage.

Where the allowance for aligning a mask pattern is set at 0.5F ("F" denoting the minimum size in the manufacturing process of the cell) in the DRAM cell shown in each of FIGS. 2 and 3, the long sides of the conventional cells in FIGS. 2 and 3 are 5.5F and 4.5F, respectively. On the other hand, the long side of the pattern portion covering the transistor Q1 and the capacitor C1 is 4.5F in the DRAM cell of the present invention shown in FIG. 8A, which is substantially equal to that of the conventional cell. However, the long side of the pattern portion covering a pair of the transistor Q2 and the capacitor C2, a pair of the transistor Q3 and the capacitor C3, or a pair of the transistor Q4 and the capacitor C4 is 3F in the DRAM cell shown in FIG. 8A. In this case, the capacitance of the capacitors C1 to C4 is set $C1<C2<C3<C4$ without changing the area of each of the capacitors. In other words, the long side of the entire cell is 13.5F in the DRAM cell shown in FIG. 8. It follows that, in the case of a memory system of one bit per capacitor, the long side per bit of the cell is 3.375F in the present invention, which is 75% of the long side in the conventional cell shown in FIG. 3 and only 61% of the long side in the conventional cell shown in FIG. 2. Clearly, the present invention permits markedly diminishing the area per bit of the cell, leading to an improved integration density.

It should also be noted that the area of each of the capacitors C1 to C4 included in the DRAM cell of the present invention shown in FIG. 8A is smaller than that of the capacitor C included in the conventional cell shown in FIGS. 2 and 3. This may suggest that a capacitor capacitance Cs is diminished in the present invention, leading to an increase in a ratio Cb/Cs of a bit capacitance Cb to the capacitor capacitance Cs. However, two DRAM cells are connected to the node N1 in the present invention, though only one DRAM cell is shown in the drawing. In other words, one bit line contact is used for 8 bits (½ bit contact line per 4 bits), with the result that the bit capacitance Cb is also markedly diminished in the present invention. It follows that the value of Cb/Cs ratio is smaller in the present invention than in the prior art, leading to a larger change in potential in the data reading step. What should also be noted is that the marked reduction in the bit capacitance Cb permits saving of power consumption.

Incidentally, it is possible to increase the capacitor capacitance Cs, though a process change is required to some extent in this case, as described in, for example, "1988 IEDM Technical Digest, pp. 592-595 '3-DIMENSIONAL STACKED CAPACITOR CELL FOR 16M AND 64M DRAMS' by T. EMA et al" or "Stacked Capacitor Cells for High-density Dynamic RAMs" by H. WATANABE et al on pp. 600-603 of the literature noted above. In this case, the array is constructed to include one bit at every intersection between the bit line and the word line.

The DRAM cell of the present invention shown in FIGS. 8A and 8B is of a stacked cell structure. However, the present invention also permits providing a DRAM cell of a cross point cell structure by employing the technique described in, for example, "1989 IEDM Technical Digest, pp. 23-26, 'A Surrounding Gate Transistor (SGT) Cell for 64/256Mbit DRAMs' by K. SUNOUCHI et al".

FIG. 9A is a cross sectional view examplifying a DRAM cell of the present invention utilizing a cross point cell structure. On the other hand, FIG. 9B is an equivalent circuit diagram of the cell shown in FIG. 9A. In this embodiment, a pair of a vertical transistor and a vertical capacitor is stacked upon another pair in the vertical direction. It should be noted that the bit portion covering the number of pairs of the stacked vertical transistors and vertical capacitors can be integrated into a cell size equal to the one bit portion in the prior art. As seen from the drawings, the DRAM cell comprises a p type semiconductor substrate 61 having a convex portion partially formed on the surface, an n+ type drain region 62 of a transistor Q1 formed on the upper surface of the convex portion of the substrate 61, gate (word lines) 631 (WL1) of the transistor Q1, gate (word lines) 632 (WL2) of the transistor Q2 formed in the side surfaces of the convex portion of the substrate with gate insulation films interposed between these gates and the substrate, an n+ type conductive layers 64, i.e., the source region of the transistor Q1, storage node of a capacitor C1, drain region of a transistor Q2, partially formed on the size surface of the convex portion of the substrate 61, an n+ type source region 65 of the transistor Q2 formed in the lower end portions of the side surfaces of the convex portion of the substrate, a plate electrode 66 of a capacitor C1 or C2 partially formed on the size surface of the convex portion of the substrate with a gate insulation film interposed between the plate 66 and the substrate, a bit line BL, a contact 67 (bit line contact) between the bit line BL and the drain region 62 of the transistor Q1, and a p+ type element isolation region 68.

In each of the DRAM cells shown in FIGS. 4 and 6, the other ends of the capacitors C1 to C4 are commonly connected to the capacitor plate potential VPL. However, it is also possible to connect each of the other ends of the capacitors C1 to C4 to a power source potential VCC given from the outside or to the ground potential VSS.

It is also possible to achieve the DRAM cell of the present invention by utilizing the technique of allowing the capacitor plate to perform the clock operation, as described in "IEEE JOURNAL OF SOLID-STATE CIRCUITS, VOL.SC-17, NO. 5, p-872, Oct. 1982, 'A Storage -Node-Boosted RAM with Word-Line Delay Compensation' by K. FUJISHIMA et al". FIG. 10 is an equivalent circuit diagram of the DRAM cell prepared by applying the technique described in this literature to, for example, the DRAM cell shown in FIG. 4. In this case, capacitor wirings PL1 to PL4 are connected to the other ends of the capacitors C1 to C4, respectively, as shown in FIG. 10.

It is also possible to achieve the DRAM cell of the present invention by utilizing the technique of connecting transfer gates to both ends of each of the capacitors, as described in "1989 Symposium of VLSI Circuits, Digest of Tech. Papers, pp. 101–102, 'A Novel Memory Cell Architecture for High-Density DRAMs', FIG. 1(b), by Y. OHTA et al". FIG. 11 is an equivalent circuit diagram of the DRAM cell prepared by applying the technique described in this literature to the DRAM cell shown in FIG. 4. On the other hand, FIG. 12 is an equivalent circuit diagram of the DRAM cell prepared by applying the technique described in this literature to the DRAM cell shown in FIG. 6.

The DRAM cell shown in FIG. 11 comprises cascade-connected second MOS transistors Q1a to Q4a acting as transfer gates. The sources of these transistors Q1a to Q4a are connected to the other ends of the capacitors C1 to C4, respectively, and the gates of these second transistors Q1a to Q4a are connected to the gates of the first transistors Q1 to Q4, respectively. Further, the drains of the first and second transistors Q1 and Q1a are connected to complementary bit lines BL and $\overline{BL}$, respectively. Incidentally, it is possible to connect the drains of these transistors Q1 and Q1a directly to pair of differential input terminals of the sense amplifier.

The DRAM cell shown in FIG. 12 comprises cascade-connected second MOS transistors Q1a to Q5a acting as transfer gates. In this embodiment, the connection nodes between adjacent second transistors are connected to the other ends of the capacitors C1 to C4, respectively. Also, the gates of the second transistors Q1a to Q5a are connected to the gates of the first transistors Q1 to Q5, respectively. The first and second transistors Q1 and Q1a are connected at one end to complementary bit lines BL1 and $\overline{BL1}$, respectively. Likewise, the first and second transistors Q5 and Q5a are connected at the other end to complementary bit lines BL2, $\overline{BL2}$, respectively. Incidentally, it is possible to connect the other ends of the transistors Q5, Q5a to the complementary bit lines BL1, $\overline{BL2}$, respectively, such that the transistors Q1, Q5 are commonly connected to the bit line BL1 and the transistor Q1a and Q5a commonly to the bit line $\overline{BL1}$.

In each of the embodiments described above, the DRAM cell is constructed such that one bit signal of "1" or "0" (one digital data) is stored in a single capacitor. However, it is possible to construct the DRAM cell such that data consisting of a plurality of bits is stored in a single capacitor.

As described above in detail, the semiconductor memory cell of the present invention permits markedly diminishing the cell area per bit using the conventional process technology, leading to a marked reduction in the unit cost per bit. It follows that the present invention makes it possible to avoid the problem inherent in the prior art, i.e., the problem that the manufacturing process is made highly complex and the manufacturing time is increased with increase in the integration density. Further, if a new process technique is developed, the integration density can be further enhanced drastically by the present invention. Moreover, the possibility is reduced that data changes as the bits forming it are sequentially read from the capacitors of the memory cells. This is because the capacitors have, as described above, a specific relationship in terms of their capacitances—that is, the farther the capacitor is located from the first node, the greater its capacitance.

Obviously, the present invention serves, in particular, to manufacture DRAMs having a large storage capacity at low cost, which can be used in place of memory media such as magnetic disks.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory comprising:
   a memory cell array formed of a plurality of memory cell units, each of the memory cell units including:
   a first node for reading data;

a first cascade gate including a plurality of cascade-connected first MOS transistors and having a one end connected to said first node; and a plurality of capacitors for data storage each having a first electrode connected to one of said first MOS transistors at an end of said one first MOS transistor remote from said first node, said capacitors having a predetermined relationship with respect to each capacitance of said capacitors; and word lines respectively connected to gates of said first MOS transistors for supplying signals to control the ON/OFF switching of said first MOS transistors, wherein data stored in said capacitors is output to said first node in a sequence, and the predetermined relationship of said capacitors is such that the capacitor whose data is output last in said sequence has a greater capacitance than the capacitor whose data is output first in said sequence.

2. A semiconductor memory comprising:

a memory cell array formed of a plurality of memory cell units, each of the memory cell units including:

a first node for reading data;

a second node for writing data;

a first cascade gate including at least three cascade-connected first MOS transistors arranged between said first node and said second node; and a plurality of capacitors for data storage each having a first electrode connected to a connection node between adjacent ones of said first MOS transistors, said capacitors having a predetermined relationship with respect to each capacitance of said capacitors; and word lines respectively connected to gates of said first MOS transistors for supplying signals to control the ON/OFF switching of said first MOS transistors; wherein data stored in said capacitors is output to said first node in a sequence, and the predetermined relationship of said capacitors is such that the capacitor whose data is output last in said sequence has a greater capacitance than the capacitor whose data is output first in said sequence.

3. The semiconductor memory according to claim 2, wherein said first node and said second node are connected to each other.

4. The semiconductor memory according to claim 1 or 2, wherein the relationship relates to the order of outputting data from said capacitors.

5. The semiconductor memory according to claim 4, wherein relationship is set such that the more remote from said first node the capacitors of the memory cell are located, the larger capacitance they have.

6. The semiconductor memory according to claim 1 or 2, wherein said first node is connected to a bit line of a memory cell array.

7. The semiconductor memory according to claim 1 or 2, wherein second electrodes of said capacitors are commonly connected to a wiring.

8. The semiconductor memory according to claim 1 or 2, wherein said capacitors have a common plate electrode, and a predetermined capacitor plate potential is applied to said common plate electrode.

9. The semiconductor memory according to claim 1 or 2, wherein second electrodes of said capacitors are respectively connected to one of a plurality of different wirings.

10. The semiconductor memory according to claim 1 or 2, wherein the memory cell further comprises a second cascade gate including a plurality of cascade-connected second MOS transistors, the number of said second MOS transistors being equal to the number of first MOS transistors, each of said second MOS transistors having one end connected to a second electrode of one of said capacitors and each of said second MOS transistors having a gate connected to a gate of one of said first MOS transistors.

11. The semiconductor memory according to claim 10, wherein said first node and one end of said second cascade gate are respectively connected to first and second complementary bit lines of a memory cell array.

12. The semiconductor memory according to claim 2, further comprising:

a second cascade gate including a plurality of cascade-connected second MOS transistors, the number of said second MOS transistors being equal to the number of first MOS transistors, each of said second MOS transistors having one end connected to a second electrode of one of said capacitors and each of said second MOS transistors having a gate connected to a gate of one of said first MOS transistors, wherein said first node and one end of said second cascade gate are respectively connected to first and second complementary bit lines of a memory cell array and said second node and another end of said second cascade gate are respectively connected to third and fourth complementary bit lines.

13. The semiconductor memory according to claim 2, further comprising:

a second cascade gate including a plurality of cascade-connected second MOS transistors, the number of said second MOS transistors being equal to the number of first MOS transistors, each of said second MOS transistors having one end connected to a second electrode of one of said capacitors and each of said second MOS transistors having a gate connected to a gate of one of said first MOS transistors, wherein said first node and said second node are connected to each other, and one end and another end of said second cascade gate are connected to each other.

14. The semiconductor memory according to claim 13, wherein the connection point between said first node and said second node is connected to a first bit line of a memory cell array, and the connection point between said one end and said another end of said second cascade gate is connected to a second bit line complementary to said first bit line.

15. The semiconductor memory according to claim 1, wherein said memory cell unit is of stacked cell structure constructed such that the source, drain and channel regions of each of said first MOSD transistors are linearly arranged on a semiconductor substrate surface, and storage electrodes of said capacitors are in contact with the source regions or drain regions of the first MOS transistors.

16. The semiconductor memory according to claim 15, wherein said memory cell unit comprises four first MOS transistors and four capacitors.

17. The semiconductor memory according to clam 2, wherein said memory cell unit is of stacked cell structure constructed such that the source, drain and channel regions of each of said cascade-connected first MOS transistors are linearly arranged on a semiconductor substrate surface, and storage electrodes of said capacitors are in contact with the source-drain regions of the cascade-connected first MOS transistors 18. The semiconductor memory according to claim 17, wherein said memory cell unit comprises five first MOS transistors and four capacitors.

19. The semiconductor memory according to claim 1 or 2, wherein said memory cell unit is of cross-point cell structure constructed such that said first MOS transistors and said capacitors are at least partially stacked one upon the other in the vertical direction 20. The semiconductor memory according to claim 1 or 2, further comprising:
a precharge circuit for precharging said first node to a predetermined potential prior to outputting data from said capacitors.

21. The semiconductor memory according to claim 1 or 2, wherein the predetermined relationship of said capacitors is given by $$C_n = C_1 * \{b + (C_1/C_B)\}^{n-1}$$

where $C_1$ is the capacitance of the capacitor whose data is output first in said sequence, $C_n$ is the capacitance of the capacitor whose data is output nth is said sequence, and $C_B$ is the floating capacitance connected to said first node.

22. A semiconductor memory, comprising;
a first read/write data node;
a first MOS transistor having first and second terminals, said first terminal of said first MOS transistor connected to said first read/write data node;
a second MOS transistor having first and second terminals, said first terminal of said second MOS transistor connected to said second terminal of said first MOS transistor;
first and second data storage capacitors respectively connected to said second terminals of said first and second MOS transistors, said first data storage capacitor having a first capacitance and said second data storage capacitor having a second capacitance for compensating a voltage variation at said first read/write data node when data is sequentially output from said first and second data storage capacitors, wherein the second capacitance is greater than the first capacitance.

23. The semiconductor memory according to claim 2, further comprising:
word lines respectively connected to gates of said first and second MOS transistors for supplying signals to control the ON/OFF switching of said first and second MOS transistors.

24. The semiconductor memory according to claim 23, wherein said
signals switch said first and second MOS transistors such that data is sequentially read and sequentially written to said data storage capacitors, the signals switching said first MOS transistor ON, subsequently switching said second MOS transistor ON, subsequently switching said second MOS transistor OFF, and subsequently switching said first MOS transistor OFF.

25. The semiconductor memory according to claim 24, further comprising:
a precharge circuit for precharging said first read/write data node to a predetermined potential prior to outputting data from said first and second data storage capacitors.

26. The semiconductor memory according to claim 24, further comprising:
a sense amplifier for sensing data output to said first read/write data node.

27. The semiconductor memory according to claim 23, further comprising:
a write circuit for supplying data t said first read/write data node for writing to said first and second data storage capacitors.

28. The semiconductor memory according to claim 27, wherein said
signals switch said first and second MOS transistors such that data supplied to said first read/write data node by said write circuit is sequentially written to said first and second data storage capacitors.

29. The semiconductor memory according to claim 22, wherein said first and second data storage capacitors each comprise first and second electrodes, said first electrodes respectively connected to said second terminal of each of said first and second MOS transistors and said second electrodes connected to a predetermined potential.

30. The semiconductor memory according to claim 22, wherein:
each of said first and second MOS transistors has a drain region corresponding to said first terminal thereof, a source region corresponding to said second terminal thereof, and a channel region located between said drain and source regions, said drain, channel, and source regions of each of said first and second MOS transistors arranged linearly on a surface of a semiconductor substrate; and
each of said first and second data storage capacitors has a storage electrode an insulating film, and a plate electrode, said first data storage capacitor having a stack structure wherein said storage electrode of said first data storage capacitor contacts said source region of said first MOS transistor and said second data storage capacitor having a stack structure wherein said storage electrode of said second data storage capacitor contacts said source region of said second MOS transistor.

31. A semiconductor memory, comprising:
a first read/write data node;
a first MOS transistor having first and second terminals, said first terminal of said first MOS transistor connected to said first read/write data node;
a second MOS transistor having first and second terminals, said first terminal of said second MOS transistor connected to said second terminal of said first MOS transistor;
first and second data storage capacitors respectively connected to said second terminals of said first and second MOS transistors, said first data storage capacitor having a first capacitance and said second data storage capacitor having a second capacitance for compensating a voltage variation at said first read/write data node when data is sequentially output from said first and second data storage capacitors, wherein:
each of said first and second MOS transistor has a drain region corresponding t said first terminal thereof, a source region corresponding to said second terminal thereof, and a channel region located between said drain and source regions, said drain region of said first MOS transistor formed on an upper surface of a projection formed on a surface of a semiconductor substrate, said channel and source regions of said first MOS transistor formed on a side surface of said projection, and said drain, channel and source regions of said second MOS transistor formed on said side surface of said projection and located below said source region of said first MOS transistor; and each of said first and second data storage capacitors has a storage electrode, an insulating film, and a plate electrode, said storage electrode of said first data storage capacitor located on said side surface of said projection and extending continuously between said source region of said first MOS transistor and said drain region of said second MOS transistor and said storage electrode of said second data storage capacitor located on said side surface of said projection and extending continuously in said source region of said second MOS transistor.

32. The semiconductor memory according to claim 22, wherein aid first and second data storage capacitors each comprise first and second electrodes, said first electrodes respectively connected to said second terminal of said first and second MOS transistors and said second electrodes receiving respective clock signals.

33. The semiconductor memory according to claim 22, further comprising:
   a second read/write data node;
   a third MOS transistor having first and second terminals, said first terminal of said third MOS transistor connected to said second read/write data node;
   a fourth MOS transistor having first and second terminals, said first terminal of said fourth MOS transistor connected to said second terminal of said third MOS transistor, wherein
   said first data storage capacitor is connected between said second terminal of said first MOS transistor and said second terminal of said third MOS transistor, and
   said second data storage capacitor is connected between said second terminal of said second MOS transistor and said second terminal of said fourth MOS transistor.

34. A semiconductor memory, comprising:
   first and second rad/write data nodes;
   a first MOS transistor having first and second terminals, said first terminal of said first MOS transistor connected to said first read/write data node;
   a second MOS transistor having first and second terminals, said second terminal of said second MOS transistor connected to said second read/write data node;
   a third MOS transistor having first and second terminals respectively coupled between said second terminal of said first MOS transistor and said first terminal of said second MOS transistor;
   first and second data storage capacitors respectively connected to said second terminals of said first and third MOS transistors, said first data storage capacitor having a first capacitance and said second data storage capacitor having a second capacitance for compensating a voltage variation at said first read/write data node when data is sequentially output from said first and second data storage capacitors, wherein the second capacitance is greater than the first capacitance.

35. The semiconductor memory according to claim 34, wherein said first and second read/write data nodes are connected to each other.

36. The semiconductor memory according to claim 34, further comprising:
   word lines respectively connected to gates of said first, second, and third MOS transistors for supplying signals to control the ON/OFF switching of said first, second, and third MOS transistors.

37. The semiconductor memory according to claim 36, wherein said
   signals switch said first, second, and third MOS transistors such that data is sequentially read and sequentially written to said data storage capacitors, the signals switching said first MOS transistor ON, subsequently switching said third OS transistor ON, subsequently switching said second MOS transistor ON, subsequently switching said first MOS transistor OFF, subsequently switching said third MOS transistor OFF, and subsequently switching said second MOS transistor OFF.

38. The semiconductor memory according to claim 37, further comprising:
   a precharge circuit for precharging said first and second read/write data nodes to a predetermined potential prior outputting data from said first and second data storage capacitors.

39. The semiconductor memory according to claim 37, further comprising:
   a sense amplifier for sensing data output to said first and second read/write data nodes.

40. The semiconductor memory according to claim 36, further comprising:
   a write circuit for supplying data to said first and second read/write data nodes for writing to said first and second data storage capacitors.

41. The semiconductor memory according to claim 40, wherein said
   signals switch said first, second, and third MOS transistors such that data at said first and second read/write data nodes is sequentially written to said first and second data storage capacitors.

42. The semiconductor memory according to claim 34, wherein said first and second data storage capacitors each comprise first and second electrodes, said first electrodes respectively connected to said second terminal of said first and third MOS transistors and said second electrodes each connected to a predetermined potential.

43. The semiconductor memory according to claim 34, further comprising:
   third and fourth read/write data nodes;
   a fourth MOS transistor having first and second terminals, said first terminal of said fourth MOS transistor connected to said third read/write data node;
   a fifth MOS transistor having first and second terminals, said second terminal of said fifth MOS transistor connected to said fourth read/write data node;
   a sixth MOS transistor having first and second terminals respectively coupled between said second terminal of said fourth MOS transistor and said first terminal of said fifth transistor, wherein
   said first data storage capacitor is connected between said second terminal of said first MOS transistor and said second terminal of said fourth MOS transistor, and
   said second data storage capacitor is connected between said second terminal of said third MOS transistor and said second terminal of said sixth MOS transistor.

* * * * *